(12) United States Patent
Ramaraju et al.

(10) Patent No.: US 7,242,626 B2
(45) Date of Patent: Jul. 10, 2007

(54) METHOD AND APPARATUS FOR LOW VOLTAGE WRITE IN A STATIC RANDOM ACCESS MEMORY

(75) Inventors: Ravindraraj Ramaraju, Round Rock, TX (US); Prashant U. Kenkare, Austin, TX (US); Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 55 days.

(21) Appl. No.: 11/123,484

(22) Filed: May 6, 2005

(65) Prior Publication Data

US 2006/0250838 A1 Nov. 9, 2006

(51) Int. Cl.
*G11C 7/00* (2006.01)
(52) U.S. Cl. .................. 365/203; 365/154; 365/226
(58) Field of Classification Search ................ 365/154, 365/203, 226
See application file for complete search history.

(56) References Cited

U.S. PATENT DOCUMENTS

| | | | |
|---|---|---|---|
| 5,715,191 A * | 2/1998 | Yamauchi et al. .......... | 365/156 |
| 5,991,192 A | 11/1999 | Wang et al. | |
| 6,097,651 A * | 8/2000 | Chan et al. .................. | 365/203 |
| 2006/0114711 A1* | 6/2006 | Khellah et al. ............. | 365/154 |

OTHER PUBLICATIONS

Takeda "A Read-Static-Noise-Margin-Free SRAM Cell for Low-$V_{dd}$ and High-Speed Applications" 2005 IEEE International Solid-State Circuits Conference, Feb. 2005.
Woodward "Clocked-Sense-Amplifier-Based Smart-Pixel Optical Receivers" IEEE Phototonics Technology Letters, vol. 8, No. 8, Aug. 1996.
Woodward "Demultiplexing 2.48-Gb/s Optical Signals with a CMOS Receiver Array Based on Clocked-Sense-Amplifiers" IEEE Photonics Technology Letters, vol. 9, No. 8, Aug. 1997.

* cited by examiner

*Primary Examiner*—Hoai V. Ho
(74) *Attorney, Agent, or Firm*—James L. Clingan, Jr.; Daniel D. Hill

(57) ABSTRACT

An integrated circuit memory includes a plurality of memory cells, where each of the plurality of memory cells comprises a first storage node and a second storage node. Each of the plurality of memory cells comprises a transistor coupled between the first and second storage nodes and responsive to an equalization signal. An equalization control circuit provides the equalization signal to selected memory cells of the plurality of memory cells. The equalization control circuit is for equalizing a voltage between the first and second storage nodes to enable to a write operation of the selected memory cells. During the write operation a data signal is provided to a first bit line that swings between a logic high voltage equal to a power supply voltage and a logic low voltage equal to ground potential. The transistor and the equalization control circuit enables reliable memory operation at low power supply voltages.

18 Claims, 2 Drawing Sheets

METHOD AND APPARATUS FOR LOW VOLTAGE WRITE IN A STATIC RANDOM ACCESS MEMORY

FIELD OF THE INVENTION

This invention relates generally to memories, and more particularly to writing static random access memories in a low voltage power supply environment.

RELATED ART

Integrated circuits are using lower and lower power supply voltages in order to reduce current leakage. This has created a number of problems in general for circuit designs of almost all types. In regard to static random access memories (SRAMs) both the bit cell read and write operations have been adversely affected. What further compounds this problem with SRAMs is that the types of things that improve the read tend to degrade the write. Similarly, the things that tend to improve the write degrade the read. Thus, there is a need to improve one without degrading the other.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

In one aspect, a static random access memory (SRAM) has an array with memory cells with cross coupled inverters, which is typical for SRAMs. In order to improve the reliability of the write operation, the outputs of the inverters are coupled together by an equalization transistor during the beginning portion of the write operation. There is a time during the write in which both write data is applied to the memory cells and the outputs of the inverters are being shorted. After both of these have occurred together, the equalization transistor is made non-conductive so that the inverters can assume the logic state being written. This is achieved with write data that is provided at the full rail of the power supply voltages in order to obtain reliable write. This improves the write reliability while allowing for improving the read operation as well. This is better understood with reference to the FIGs. and the following description.

Figure 1:
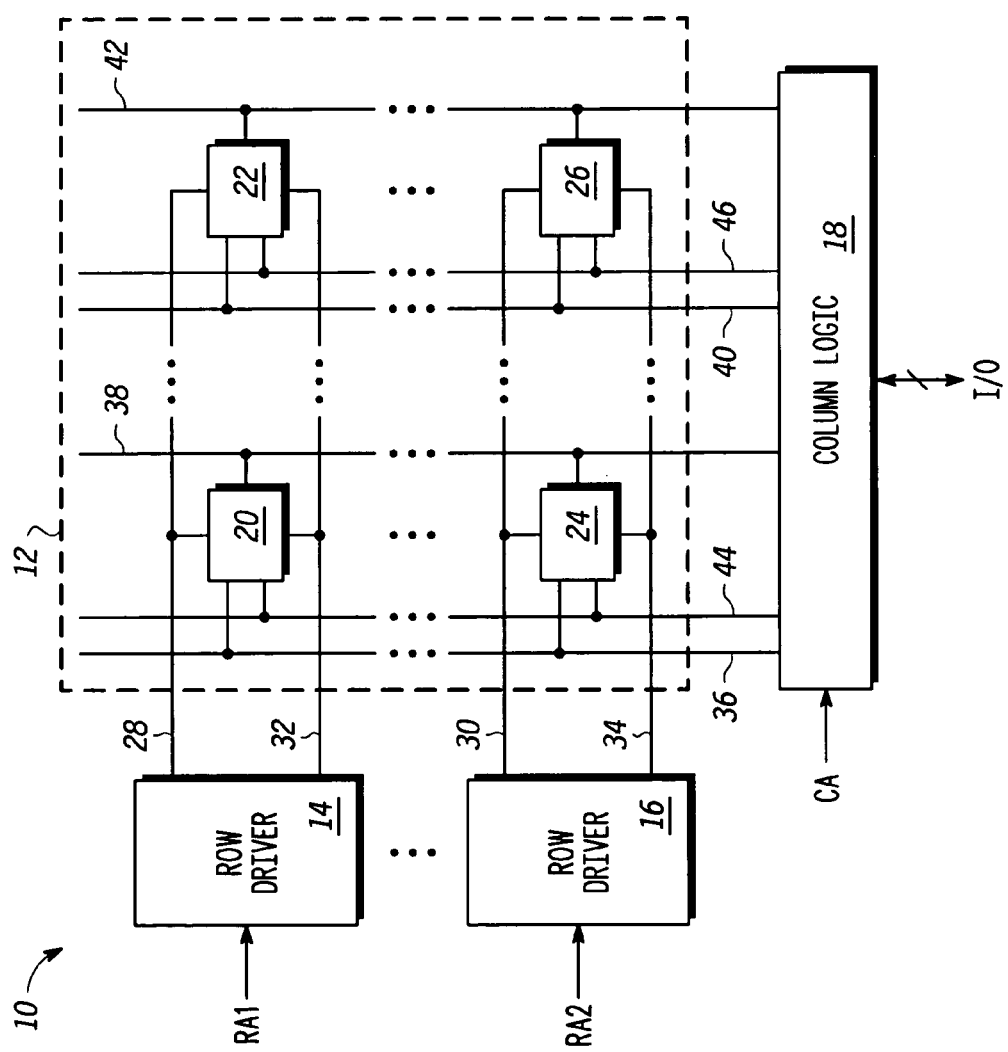
FIG. 1 is a block diagram of a memory according to an embodiment of the invention.

Shown in FIG. 1 is a memory 10 comprising an array 12, a row driver 14, a row driver 16, and column logic 18. Array 12 comprises memory cells 20, 22, 24, 26; word lines 28 and 30, equalization lines 32 and 34; bit lines 36, 38, 40, and 42; and bit write enable lines 44 and 46. Row driver 14 has a word line output connected to word line 28, an equalization output coupled to equalization line 32, and an input for receiving a row address signal RA1. Row driver 16 has a word line output connected to word line 30, an equalization output coupled to equalization line 34, and an input for receiving a row address signal RA2. Column logic 18 has a first input/output (I/O) connected to bit line 36, a second I/O connected to bit line 38, a third I/O connected to bit line 40, a fourth I/O connected to bit line 42, a first output connected to bit write enable line 44, a second output connected to a bit write enable line 46, an address input for receiving column address CA, and a fifth I/O for providing a data output signal and receiving a data input signal.

Memory cell 20 has a word line input connected to word line 28, a first data terminal connected to bit line 36, a second data terminal connected to bit line 38, an equalization input connected to equalization line 32, and a bit write enable input connected to bit write enable line 44. Memory cell 22 has a word line input connected to word line 28, a first data terminal connected to bit line 40, a second data terminal connected to bit line 42, an equalization input connected to equalization line 32, and a bit write enable input connected to bit write enable line 46. Memory cell 24 has a word line input connected to word line 30, a first data terminal connected to bit line 36, a second data terminal connected to bit line 38, an equalization input connected to equalization line 34, and a bit write enable input connected to bit write enable line 44. Memory cell 26 has a word line input connected to word line 30, a first data terminal connected to bit line 40, a second data terminal connected to bit line 42, an equalization input connected to equalization line 34, and a bit write enable input connected to bit write enable line 46.

Memory 10 is shown with only four cells of two rows and two columns, but memory 10 includes many more rows and columns made up of many more memory cells. Row drivers 14 and 16 each comprise both a word line driver and an equalization control circuit. Similarly, column logic 18 comprises sense amplifiers, a column decoder, write drivers, and bit write enable circuits.

In operation, memory 10 has a read performed in conventional fashion by selecting a word line and detecting states of some or all of the memory cells along that selected word line. A write is performed also by selecting a word line, and some or all of the cells on that selected word line are written with data received by column logic 18. Column logic 18 applies the data to be written along bit lines, such as bit lines 36, 38, 40, and 42. In conjunction with the word lines and bit lines being utilized, equalization lines and bit write enable lines of the selected memory cells are enabled. For example, if memory 20 is to be written, word line 28, equalization line 32 and bit write enable line 44 are enabled, and data is applied to bit lines 36 and 38. Bit lines 36 and 38 carry complementary data so that there is a voltage differential of substantially VDD applied between bit lines 36 and 38. While data is being applied to bit lines 36 and 38 and word line 28 remains enabled, equalization line 32 and bit write enable line 44 are enabled by row driver 14 and column logic 18, respectively. Only after either write enable line 44 or equalization line 32 is disabled is word line 28 disabled.

Figure 2:
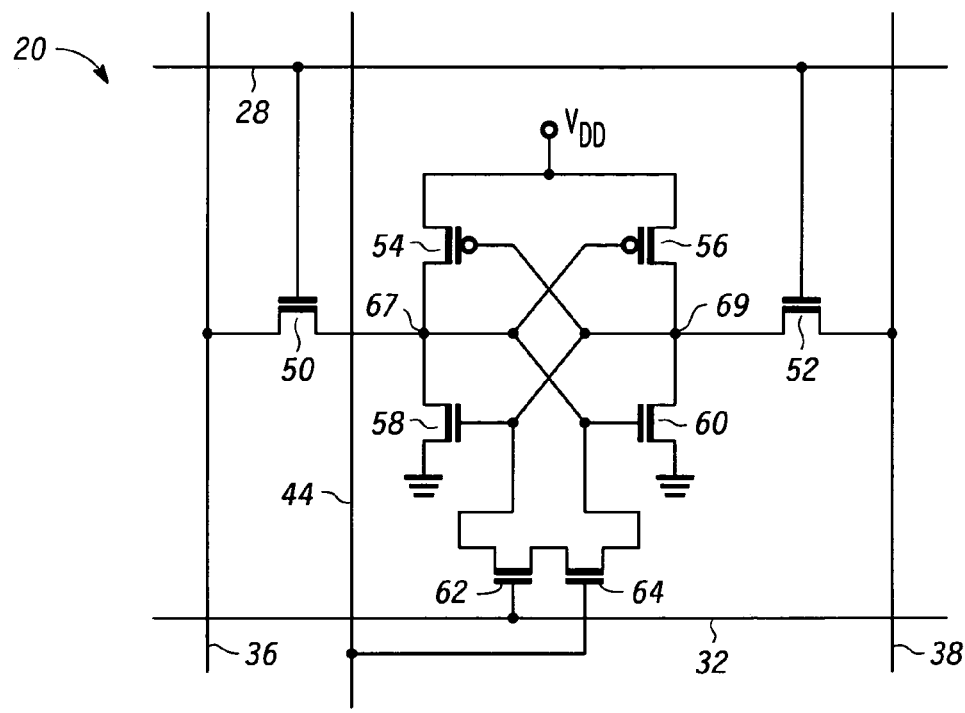
FIG. 2 is a circuit diagram of a memory cell useful in the memory of FIG. 1.

Shown in FIG. 2 is memory cell 20, representative of all of the memory cells of memory 10, in more detail. Memory cell 20 comprises transistors 50, 52, 54, 56, 58, 60, 62, and 64. In this embodiment all of the transistors are N channel transistors except transistors 54 and 56, which are P channel transistors. Transistors 54 and 58 comprise one inverter and transistors 56 and 60 comprise another inverter. These two inverters, connected between VDD and ground, are cross-coupled to form the storage element of memory cell 20. Transistor 50 has a gate connected to word line 28, a source/drain connected to bit line 36, and a source/drain connected to a node 67 which is a first storage node of the storage element. Transistor 52 has a gate connected to word line 28, a source/drain connected to bit line 38, and a source/drain connected to a node 69 which is a second storage node of the storage element. The gates of transistors 50 and 52 form the word line input of memory cell 20. Transistors 62 and 64 are connected in series and between nodes 67 and 69. The gate of transistor 62 is connected to equalization line 32. The gate of transistor 64 is connected to bit write enable line 44.

In operation, transistors 62 and 64 short nodes 67 and 69 together when equalization line 32 and bit write enable line 44 are enabled. In this example, enabled is the logic high state. During a write of memory cell 20, as explained previously, word line 28 is enabled and bit lines 36 and 38 carrying data. This data is substantially full rail complementary data, which in this case means that one of bit lines 36 and 38 is at substantially VDD and the other bit line is substantially at ground. In this example, VDD is about one volt. With VDD at only one volt and the write driver in column logic 18 being supplied at only one volt, there is limited drive capability driving storage nodes 67 and 69. If transistors 58 and 60 are optimized for reading they will be relatively large devices. This will result in it being very difficult to reverse the logic state stored at nodes 67 and 69. This difficulty is overcome by using transistors 62 and 64 to equalize the voltages at nodes 67 and 69. While nodes 67 and 69 are being equalized, the write driver actively drives bit lines 36 and 38 to a substantially full rail separation pushing a differential current through transistors 58 and 60. The current path through transistors 62 and 64 is disabled while transistors 50 and 52 remain conductive so that the bit line voltage differential is coupled to nodes 67 and 69 concurrently with the release of nodes 67 and 69 from each other. There is thus an overlap between the equalization and the word line being enabled during a write. This overlap is important in ensuring that the cell is written to the desired state and avoiding oscillation in the storage nodes, but has the detrimental effect of using significant current. Thus the overlap is designed to be the minimum required to ensure a reliable write. An effective technique for achieving this minimum required overlap is for the equalization signal to be used to initiate the word line becoming active, and then having the word line becoming active triggering the termination of the equalization. With the differential current already established in transistors 58 and 60 at the time the equalization is terminated, nodes 67 and 69 separate as driven by bit lines 36 and 38 upon either of transistors 62 or 64 becoming non-conductive. It is beneficial for the write driver to continue driving the write data into storage nodes 67 and 69 because at the time one of transistors 62 and 64 is disabled, only a small signal differential on storage nodes 67 and 69 is present. Therefore, the current through transfer devices 50 and 52 must be maintained to ensure that the inverters amplify the signal in the desired direction and thus ultimately latch in the desired state.

Equalization line 32 is coupled to all of the memory cells of a given row, but all of the memory cells of a selected row may not be selected for writing. For the memory cells not selected for writing, it is important that the storage not be equalized because that would destroy the data that was stored in those memory cells. Thus, memory cells in a selected row have their storage nodes equalized only if the bit write enable line to which they are connected is also enabled. This allows for word lines to have a larger number of memory cells than are written for any give write cycle. For example, a common output width for a memory is 16 bits with one bit per memory cell, but the word line length may be 256 memory cells. Thus, for such a case, the number of memory cells to be written during one write cycle is only 16 bits, but all 256 memory cells on the selected word line have their word line input and equalization input enabled. In order to avoid losing the data in the unselected 240 bits on the word line, the unselected memory cells are prevented from having their storage nodes shorted together by the bit write enable lines to which they are connected being inactive, a logic low in this example. A group of memory cells in a word line can be connected to the same bit write enable line.

Figure 3:
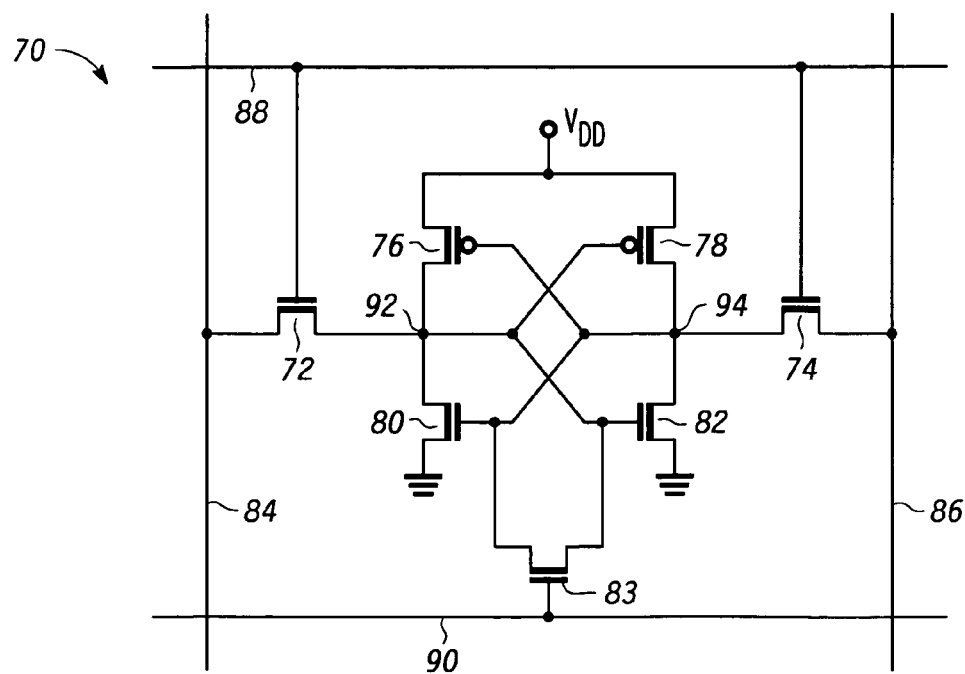
FIG. 3 is a circuit diagram of a memory cell as an alternative to that shown in FIG. 2.

Shown in FIG. 3 is a memory cell useful in a memory of the type shown in FIG. 1 but with an optional use of bit write enable lines. Memory cell 70 comprises transistors 72, 74, 76, 78, 80, 82, and 83. All of the transistors, except transistors 76 and 78, are N channel in the embodiment shown in FIG. 3. Transistors 76 and 78 are P channel transistors. Similar to memory cell 20 of FIG. 2, transistors 76 and 80 form one inverter and transistors 78 and 82 form another inverter. These two inverters are cross-coupled at storage nodes 92 and 94 to form the storage element of memory cell 70. Transistors 72 and 74 operate as pass gates enabled by a word line 88. Transistor 72 is connected between storage node 92 and a write bit line 84. Transistor 74 is connected between read bit line 86 and storage node 94. Transistor 83 is connected between nodes 92 and 94 and is controlled by an equalization line 83. Although storage nodes 92 and 94 have complementary logic states, memory 10 functions as a single-ended memory cell. Transistors 80 and 76 are relatively weak compared to transistors 82 and 78, respectively. With transistors 76 and 80 being relatively weak, they are comparatively easy to write. Thus, write data is provided only on bit line 84. On the other hand, a read is performed only with regard to bit line 86 because it is driven by relatively strong transistors 78 and 82. As an alternative, it may be beneficial to have different word lines for transistors 72 and 74.

A write operation for memory cell 70 is similar to that described with respect to memory 10 and memory cell 20. During a write, word line 88 is active to enable transistor 72 to couple the data present on bit line 84 to node 92 while transistor 83 is enabled by equalization line 90 to cause nodes 92 and 94 to be shorted. With the write signal at substantially full rail coming in on the side where relatively weak transistors 76 and 80 are providing the drive and nodes 92 and 94 being coupled together through conductive transistor 83, writing can be easily accomplished. In this condition current through transistors 80 and 76 is controlled by the write driver that is driving bit line 84. Transistor 83 is then disabled by equalization line 90 being inactivated while transistor 72 remains conductive so that the write driver is controlling the current through transistors 76 and 80 at the time nodes 92 and 94 are released from being coupled together. Thus, at the time of the disabling of transistor 83, the storage element is biased toward the desired logic state, the logic state present on bit line 84. After a short time of transistor 72 being conductive with bit line 84 having the desired logic state at substantially either VDD or ground, word line 88 is inactivated to disable transistor 72 to complete the write cycle. Another transistor analogous to that of transistor 64 of memory cell 20 may be put in series with transistor 83 for the same reasons as described for using transistor 64.

With regard to both memory cells 20 and 70, another alternative is to disable equalization lines 32 and 90 if the power supply is sufficiently high in order to save current. There is some extra current used when the storage nodes are coupled together because all four transistors that comprise the storage element are conductive in that condition. Thus, a circuit can be added that provides a signal to indicate that the power supply voltage is sufficiently high that the equalization of the storage nodes is not required. Then disable the equalization function in response to that signal.

Various changes and modifications to the embodiments herein chosen for purposes of illustration will readily occur to those skilled in the art. For example, transistor types may be reversed with a corresponding switch in logic state applied on the gate. Also these embodiments have been shown using an SOI substrate but another substrate type, such as bulk or bulk-SOI hybrid, could also be used. To the extent that such modifications and variations do not depart from the spirit of the invention, they are intended to be included within the scope thereof which is assessed only by a fair interpretation of the following claims.

What is claimed is:

1. A method for writing to a memory cell, the memory cell having a first storage node and a second storage node, the first storage node coupled to a first bit line and the second storage node coupled to a second bit line, the method comprising:

providing a power supply voltage to the memory cell;

decoupling the first and second storage nodes from the first and second bit lines;

equalizing a voltage between the first and second storage nodes;

coupling the first storage node to the first bit line through a first transistor and coupling the second storage node to the second bit line through a second pass transistor; and providing a data signal to the first storage node on the first bit line and the second bit line to write logic states, wherein the data signal is applied at a voltage substantially equal to the power supply voltage to the first bit line and a voltage substantially equal to ground potential to the second bit line to write a first logic state.

2. The method of claim 1, wherein the power supply voltage is equal to or less than one volt.

3. The method of claim 1 further comprising a range of power supply voltages, and wherein when the power supply voltage is greater than or equal to a predetermined voltage within the range of power supply voltages, the voltage between the first and second storage nodes is not equalized.

4. The method of claim 1, wherein equalizing a voltage between the first and second storage nodes comprises providing a transistor having a first current electrode coupled to the first storage node, a second current electrode coupled to the second storage node, and a control electrode for receiving a bit equalization signal.

5. The method of claim 1, wherein equalizing a voltage between the first and second storage nodes further comprises:

providing a first transistor having a first current electrode coupled to the first storage node, a second current electrode, and a control electrode for receiving a bit equalization signal; and providing a second transistor having a first current electrode coupled to the second current electrode of the first transistor, a second current electrode coupled to the second storage node, and a control electrode for receiving a enable signal.

6. The method of claim 1, wherein the method is implemented in a data processor having a memory array.

7. An integrated circuit memory comprising:

a plurality of memory cells, each of the plurality of memory cells for receiving a first power supply voltage comprising a first storage node and a second storage node, the first storage node coupled to a first bit line through a first pass transistor and the second storage node coupled to a second bit line through a second pass transistor in response to an asserted word line, each of the plurality of memory cells comprising an equalization transistor coupled between the first and second storage nodes and responsive to an equalization signal;

an equalization control circuit for providing the equalization signal to equalization transistors of selected memory cells of the plurality of memory cells, the equalization transistors for equalizing a voltage between the first and second storage nodes to enable a write operation of the selected memory cells; and, column logic means for, during the write operation, providing a data signal at a first logic state by applying to the first bit line substantially the power supply voltage and to the second bit line substantially ground potential and at a second logic state by applying to the second bit line substantially the power supply voltage and to the first bit line substantially ground potential.

8. The integrated circuit memory of claim 7, wherein the power supply voltage is equal to or less than one volt.

9. The integrated circuit memory of claim 7 wherein when the power supply voltage is greater than or equal to a predetermined voltage the equalization control circuit does not provide the equalization signal.

10. The integrated circuit memory of claim 7 wherein the equalization transistor further comprises a first current electrode coupled to the first storage node, a second current electrode, and a control electrode for receiving the equalization signal.

11. The integrated circuit memory of claim 10 further comprising a second transistor having a first current electrode coupled to the second current electrode of the transistor, a second current electrode coupled to the second storage node, and a control electrode for receiving an enable signal.

12. The integrated circuit memory of claim 7 wherein the integrated circuit memory is a portion of a data processor.

13. An integrated circuit memory comprising a plurality of memory cells, each memory cell of the plurality of memory cells comprising:

a first inverter having an input terminal coupled to a first storage node and an output terminal coupled to a second storage node for being powered by a power supply voltage;

a second inverter having an input terminal coupled to the second storage node and an output terminal coupled to the first storage node for being powered by the power supply voltage;

a first transistor having a first current electrode coupled to the first storage node, a second current electrode coupled to a first bit line, and a control electrode for receiving an address signal;

a second transistor having a first current electrode coupled to the second storage node, a second current electrode coupled to a second bit line, and a control electrode for receiving the address signal;

a third transistor having a first current electrode coupled to the first storage node, a second current electrode, and a control electrode for receiving an equalization signal;

a fourth transistor having a first current electrode coupled to the second current electrode of the third transistor, a second current electrode coupled to the second storage node, and a control electrode for receiving a enable signal; and column logic means for, during a write operation, providing a data signal at a first logic state by applying to the first bit line substantially the power supply voltage and to the second bit line substantially ground potential and at a second logic state by applying to the second bit line substantially the power supply voltage and to the first bit line substantially ground potential.

14. The integrated circuit memory of claim 13, further comprising an equalization control circuit for providing the equalization signal to selected memory cells of the plurality of memory cells, the equalization control circuit for equalizing a voltage between the first and second storage nodes to enable a write operation of the selected memory cells.

15. The integrated circuit memory of claim 14, wherein when the power supply voltage is greater than or equal to a predetermined voltage the equalization control circuit does not provide the equalization signal.

16. The integrated circuit memory of claim 15, wherein the predetermined voltage is equal to or less than one volt.

17. The integrated circuit memory of claim 13, wherein the plurality of memory cells are implemented as one of either a register file or a random access memory in a data processor.

18. A method for writing to a memory cell powered by a power supply voltage, the memory cell having a first storage node and a second storage node, the first storage node coupled to a first bit line and the second storage node coupled to a second bit line in response to a word line becoming active, the method comprising:

equalizing the storage nodes;

causing the word line to become active in response to the step of equalizing;

applying data on the first and second bit lines while the word line is active and during the step of equalizing, wherein the data is applied as a first logic state by applying to the first bit line substantially the power supply voltage and to the second bit line substantially ground potential and as a second logic state by applying to the second bit line substantially the power supply voltage and to the first bit line substantially ground potential;

terminating the step of equalizing in response to the step of causing the word line to become active; and terminating the step of applying data after the step of terminating the step of equalizing.

* * * * *